(12) United States Patent
Hirasawa et al.

(10) Patent No.: US 11,371,783 B2
(45) Date of Patent: Jun. 28, 2022

(54) LOOP HEAT PIPE, COOLING DEVICE, AND ELECTRONIC DEVICE

(71) Applicant: Ricoh Company, Ltd., Tokyo (JP)

(72) Inventors: Tomoyasu Hirasawa, Kanagawa (JP); Kiyotada Katoh, Hyogo (JP); Takeshi Endoh, Kanagawa (JP); Takashi Tanaka, Kanagawa (JP); Toshihiko Baba, Kanagawa (JP); Keisuke Ikeda, Kanagawa (JP); Hiroki Yamasaki, Yamanashi (JP)

(73) Assignee: RICOH COMPANY, LTD., Tokyo (JP)

( * ) Notice: Subject to any disclaimer, the term of this patent is extended or adjusted under 35 U.S.C. 154(b) by 17 days.

(21) Appl. No.: 16/444,212

(22) Filed: Jun. 18, 2019

(65) Prior Publication Data

US 2019/0390918 A1    Dec. 26, 2019

(30) Foreign Application Priority Data

Jun. 21, 2018    (JP) .............................. JP2018-117818

(51) Int. Cl.
| F28D 15/02 | (2006.01) |
| F28D 15/04 | (2006.01) |
| H05K 7/20 | (2006.01) |
| H01L 23/427 | (2006.01) |

(52) U.S. Cl.
CPC ..... *F28D 15/0266* (2013.01); *H05K 7/20336* (2013.01)

(58) Field of Classification Search
CPC .... F28D 9/0025; F28D 9/0031; F28D 9/0037; F28D 9/0062; F28F 2265/26; F28F 3/005; F28F 3/10

USPC ......................................... 165/104.26, 104.33
See application file for complete search history.

(56) References Cited

U.S. PATENT DOCUMENTS

| 3,857,441 A * | 12/1974 | Arcella ................. F28D 15/046 |
| | | 165/104.26 |
| 6,330,907 B1 * | 12/2001 | Ogushi ................. F28D 15/043 |
| | | 165/104.26 |
| 8,351,817 B2 | 1/2013 | Saitoh et al. |
| 8,521,053 B2 | 8/2013 | Iijima et al. |

(Continued)

FOREIGN PATENT DOCUMENTS

| JP | 2000-146471 A | 5/2000 |
| JP | 2011-190996 | 9/2011 |

(Continued)

OTHER PUBLICATIONS

Extended European Search Report dated Nov. 14, 2019, in Patent Application No. 19181382.3, 6 pages.

*Primary Examiner* — Frantz F Jules
*Assistant Examiner* — Jason N Thompson
(74) *Attorney, Agent, or Firm* — Xsensus LLP

(57) ABSTRACT

A disclosed loop heat pipe includes an evaporator configured to absorb heat from outside by a wall to evaporate a working fluid from a liquid phase to a gas phase; a condenser configured to condense a gas phase working fluid introduced from the evaporator into a liquid phase; an elastic wick configured to contact an inner wall of the evaporator by an elastic force from the elastic wick; and a wick deformation member configured to deform the elastic wick increase a contact pressure of the elastic wick against the inner wall of the evaporator.

15 Claims, 8 Drawing Sheets

(56) References Cited

U.S. PATENT DOCUMENTS

| | | | |
|---|---|---|---|
| 8,879,945 B2 | 11/2014 | Fujiya et al. | |
| 9,354,601 B2 | 5/2016 | Hirasawa et al. | |
| 9,400,485 B2 | 7/2016 | Okano et al. | |
| 2002/0020518 A1* | 2/2002 | Li | F28D 15/0233 165/104.11 |
| 2005/0051305 A1* | 3/2005 | Hsu | F28D 15/046 165/104.26 |
| 2005/0269064 A1* | 12/2005 | Hsu | F28D 15/0233 165/104.26 |
| 2007/0151708 A1* | 7/2007 | Touzov | F28D 15/046 165/104.26 |
| 2008/0105405 A1* | 5/2008 | Hsu | F28D 15/046 165/104.26 |
| 2009/0040726 A1* | 2/2009 | Hoffman | F28D 15/0233 361/700 |
| 2010/0163212 A1* | 7/2010 | Chin | F28D 15/0266 165/104.26 |
| 2012/0175094 A1* | 7/2012 | Rice | F28D 1/03 165/170 |
| 2013/0048248 A1* | 2/2013 | Lin | F28D 15/046 165/104.26 |
| 2013/0160974 A1* | 6/2013 | Uchida | F28D 15/0266 165/104.21 |
| 2017/0067696 A1* | 3/2017 | Chin | H01L 23/427 |
| 2018/0180360 A1 | 6/2018 | Katoh et al. | |
| 2019/0041143 A1* | 2/2019 | MacDonald | F28D 15/043 |

FOREIGN PATENT DOCUMENTS

| | | |
|---|---|---|
| JP | 2012-037098 | 2/2012 |
| JP | 2012-193912 A | 10/2012 |
| JP | 2014-114963 A | 6/2014 |
| WO | WO 2015/104842 A1 | 7/2015 |

\* cited by examiner

LOOP HEAT PIPE, COOLING DEVICE, AND ELECTRONIC DEVICE

CROSS-REFERENCE TO RELATED APPLICATIONS

The present application is based on and claims priority to Japanese Patent Application No. 2018-117818, filed on Jun. 21, 2018, the contents of which are incorporated herein by reference in their entirety.

BACKGROUND OF THE INVENTION

1. Field of the invention

The disclosures discussed herein relate to a loop heat pipe, a cooling device, and an electronic device.

2. Description of the Related Art

A typical loop heat pipe known in the art includes an evaporator that absorbs heat from outside by a wall of the evaporator to allow a working fluid to evaporate from a liquid phase to a gas phase; a condenser that condenses the gas phase working fluid introduced from the evaporator into a liquid phase; and an elastic wick that contacts the wall of the evaporator by elastic force from the elastic wick.

For example, Japanese Unexamined Patent Application Publication No. 2011-190996 (hereinafter referred to as "Patent Document 1") discloses a loop heat pipe including a hollow cylindrical evaporator, and an elastic wick having a diameter larger than an inner diameter of a hollow cylindrical evaporator, wherein the elastic wick is pressed into a hollow of the evaporator to allow the elastic wick to contact an inner wall of the evaporator by elastic force from the elastic wick.

However, in the loop heat pipe having such a configuration where the elastic wick comes into contact with the wall of the evaporator by elastic force from the elastic wick, the elastic wick may undergo plastic deformation due to deterioration or creep; as a result, adhesion between the wall of the evaporator and the elastic wick may be degraded over time.

RELATED ART DOCUMENT

Patent Document

Patent Document 1: Japanese Unexamined Patent Application Publication No. 2011-190996

SUMMARY OF THE INVENTION

According to an aspect of an embodiment, a loop heat pipe includes an evaporator configured to absorb heat from outside by a wall to evaporate a working fluid from a liquid phase to a gas phase; a condenser configured to condense a gas phase working fluid introduced from the evaporator into a liquid phase; an elastic wick configured to contact an inner wall of the evaporator by an elastic force from the elastic wick; and a wick deformation member configured to deform the elastic wick to increase a contact pressure of the elastic wick against the inner wall of the evaporator.

Other objects, features and advantages of the present invention will become more apparent from the following detailed description when read in conjunction with the accompanying drawings.

DETAILED DESCRIPTION OF THE PREFERRED EMBODIMENTS

First Embodiment

The following illustrates a loop heat pipe according to one embodiment of the present invention that is applied to a cooling device of an electronic device.

Figure 1:
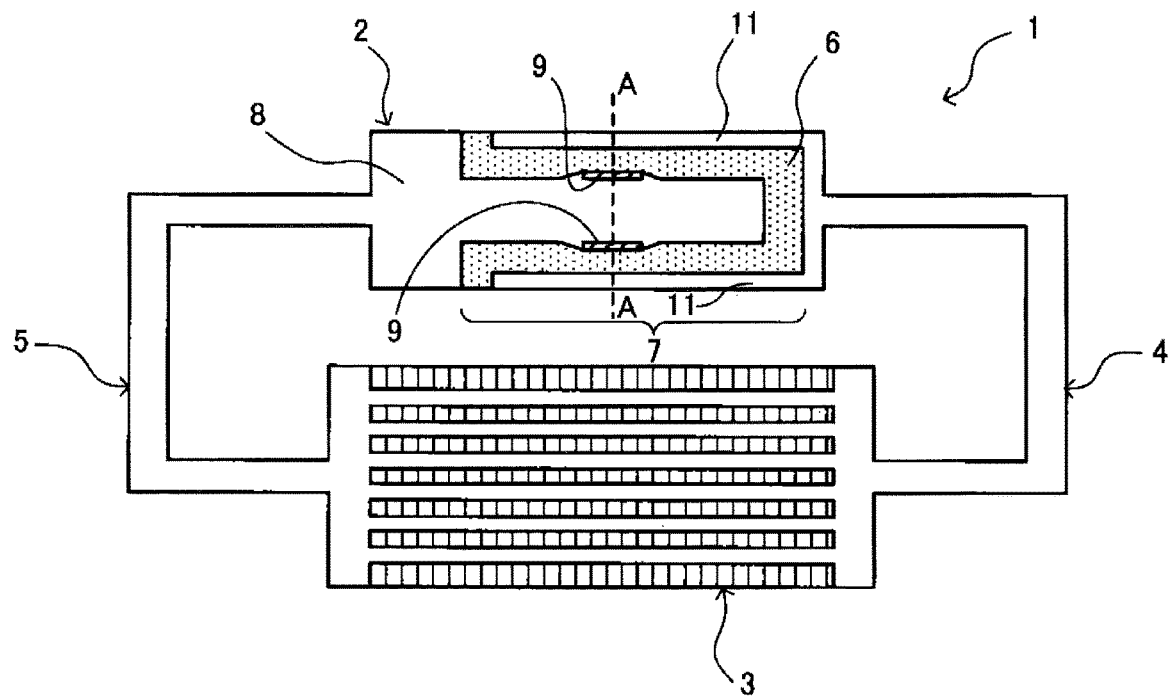
FIG. 1 is a diagram illustrating a configuration of a loop heat pipe according to an embodiment.
Figure 2:
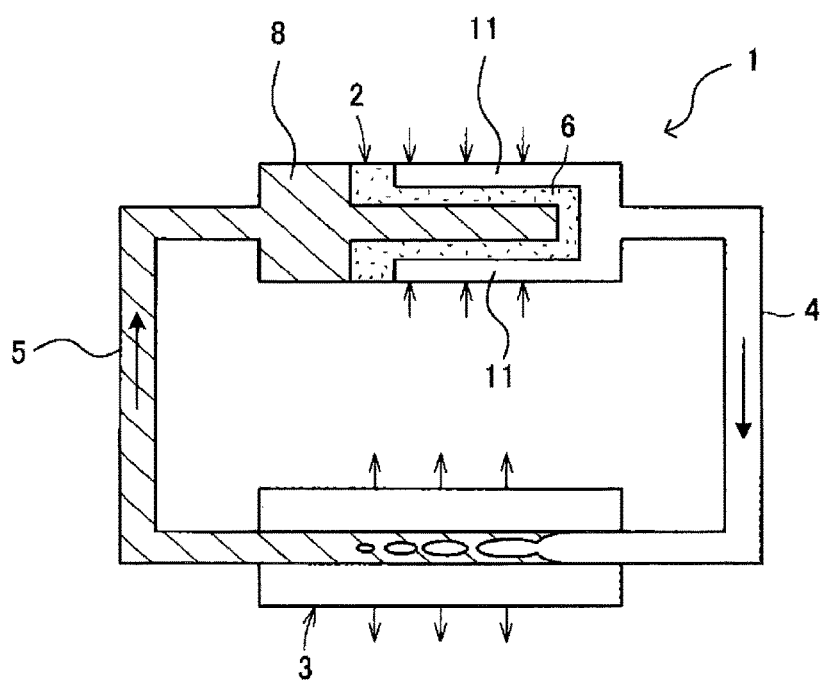
FIG. 2 is a diagram illustrating movement of heat by the same loop heat pipe.

FIG. 1 is a diagram illustrating a configuration of a loop heat pipe according to a first embodiment. FIG. 2 is a diagram illustrating movement of heat by the loop heat pipe according to the first embodiment.

The loop heat pipe 1 according to the present embodiment contains a working fluid. The loop heat pipe 1 according to the present embodiment includes an evaporator 2 configured to absorb heat from outside via a wall to allow the working fluid to evaporate from a liquid phase to a gas phase; a condenser 3 configured to condense the gas phase working fluid introduced from the evaporator 2 into a liquid phase; a steam tube 4 configured to pass the gas phase working fluid from the evaporator 2 to the condenser 3; and a liquid tube 5 configured to pass the liquid phase working fluid from the condenser 3 to the evaporator 2. While ethanol is used as the working fluid in this embodiment, other condensing fluids such as ammonia, water, alcohol, acetone, CFC substitutes, and the like may be used. A cooling object to be cooled by a cooling device, which is provided with the loop heat pipe 1 according to the present embodiment, is disposed such that heat of the cooling object is exchangeable with the evaporator 2.

The evaporator 2 is a cylindrical member made of metal having good thermal conductivity, such as copper, copper alloy, or stainless steel. The evaporator 2 includes a heat receiver 7 containing a wick 6, and a reservoir 8 storing a liquid phase working fluid. One end of a steam tube 4 is connected to the heat receiver 7, and one end of a liquid tube 5 is connected to the reservoir 8. The other end of each of the steam tube 4 and the liquid tube 5 is connected to the condenser 3.

The condenser 3 is composed of flat pipes each having numerous aluminum sheet-like fins on its outer circumference surface. The condenser 3 is configured to allow a working fluid to pass through inside the flat pipes to discharge heat of the working fluid through walls and fins of the flat pipes. The multiple flat pipes are connected to one another at their two opposite ends, where first ends of the flat pipes positioned at one end are connected to the steam tube 4, and second ends of the flat pipes positioned at the other end are connected to the liquid tube 5.

Figure 3:
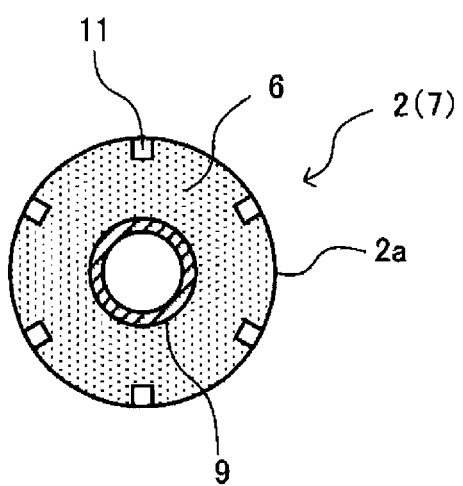
FIG. 3 is a cross-sectional diagram illustrating an evaporator of the same look; heat pipe when the evaporator is cut along a line indicated by A-A in FIG. 1.

FIG. 3 is a cross-sectional diagram illustrating an evaporator of the loop heat pipe according to the present embodiment when the evaporator is cut along a line indicated by A-A in FIG. 1. The wick 6 is a hollow member made of a porous material, and a first end of the wick 6 near the steam tube 4 is closed and a second end of the wick 6 near the reservoir 8 is open. The outer circumferential surface of the wick 6 is also provided with multiple grooves 11 in an area longitudinally extending from the first end near the steam tube 4 to immediately before the second end near the reservoir 8. As illustrated in FIG. 3, the grooves 11 are disposed at equal intervals over the circumference of the wick 6. Portions of the wick 6 provided with grooves 11 form spaces between the wick 6 and a wall 2a of the evaporator 2.

An outer diameter of a portion of the wick 6 without grooves 11 is slightly larger than an inner diameter of a housing or the wall 2a of the evaporator 2. Hence, when the wick 6 is housed in the evaporator 2, the portion of the wick 6 without the grooves 11 is in close contact with an inner circumferential surface of the wall 2a (inner wall) of the evaporator 2 by restoring force of the wick 6. As described above, since the wick 6 is in close contact with the wall 2a of the evaporator 2, external heat is efficiently transmitted to the wick 6 through the wall 2a of the evaporator 2.

The wick 6 also serves to separate the liquid and gas phases so as to prevent backflow of the gas phase working fluid into the reservoir 8.

Since the wick 6 is made of a porous material, a liquid phase working fluid stored in the reservoir 8 penetrates into the wick 6 by capillarity. This capillarity also serves as a pump for delivering a liquid phase working fluid from condenser 3 to evaporator 2. In addition, the wick 6 preferably has good wettability with the working fluid to facilitate the penetration of the working fluid. Wettability may be measured by a contact angle between the wick 6 and the working fluid. That is, the contact angle needs to be less than 90° because the contact angle being 90° or more does not allow the working fluid to penetrate the wick 6.

In the loop heat pipe 1 according to the present embodiment, when heat from the outside is conducted and propagated to the liquid phase working fluid through the wall 2a of the evaporator 2 within the wick 6, the liquid phase working fluid is evaporated by the heat to change to a gas phase working fluid. The gas phase-altered working fluid is fed through the grooves 11 to the steam tube 4. The gas phase working fluid is then fed through the steam tube 4 to the condenser 3. In the condenser 3, the heat of the working fluid passing through the interiors of the flat pipes is discharged to outside via the fins, which decreases a temperature of the working fluid to condense the working fluid, thereby changing the working fluid from the gas phase to the liquid phase. The liquid phase-changed working fluid moves through the liquid tube 5 to the evaporator 2, and penetrates into the wick 6 from the reservoir 8 by capillarity. Such circulation of the working fluid allows continuous discharge of external heat and cooling of the cooling object.

Next, the wick 6 will be described in detail. The wick 6 used in the loop heat pipe 1 according to the present embodiment is an elastic wick, and is made of porous rubber in the present embodiment. Through the wick 6 made of porous rubber in this manner, an elastic force greater than an elastic force from porous resin can be obtained. Hence, the wick 6 having an outer diameter slightly larger than the inner diameter of the wall 2a of the evaporator 2 may enable high adhesion of the wick 5 with respect to the wall 2a of the evaporator 2 due to the elastic force (restoring force) of the wick 6 contained in the evaporator 2. This increases the heat transfer efficiency from the wall 2a of the evaporator 2 to the wick 6, thereby improving the cooling performance of the loop heat pipe 1.

In addition, since the wick 6 is made of porous rubber, an elastic area of the wick 6 becomes large; this makes it possible to prevent local pore collapse due to dimensional errors during manufacturing. That is, even if the wick 6 is compressed by inserting the wick 6 inside the wall 2a of the evaporator 2, the compressive deformation of the wick 6 that would be accompanied by pore collapse is dispersed over a wide area; this prevents severe pore collapse in a local area such as in the vicinity of the outer circumference surface of the wick 6. Thus, flow obstruction of the working fluid by local pore collapse is unlikely to occur, which makes it possible to obtain smooth flow of the working fluid to achieve more reliable cooling performance.

Porous rubber used for the wick 6 may include silicone foam rubber; however, another porous rubber such as urethane foam may also be used for the wick 6. Porous rubber has multiple communicating pores formed therein in order to enable permeation of the working fluid and to generate a good capillary force with respect to the working fluid.

In this embodiment, a wick deformation member is disposed for preloading an outer circumference portion (contact area) of the wick 6 toward the wall 2a of the evaporator 2 such that the outer circumference portion of the wick 6 comes in contact with the wall 2a of the evaporator 2. The wick deformation member according to the present embodiment is a ring member 9 made of a ceramic or the like having an outer diameter larger than an inner diameter of a hollow portion of the wick 6, which is a hollow member. An elastic modulus of the wick 6 itself is used to preload the outer circumference portion of the wick 6 in a direction toward the wall 2a of the evaporator 2. That is, providing such a ring member 9 causes the hollow portion of the wick 6 to expand radially outward or toward the wall 2a of the evaporator 2 by the ring member 9. As a result of the outer circumference portion of the wick 6 expanding radially outward or toward the wall 2a of the evaporator 2, the outer circumference portion of the wick 6 is pressed against the wall 2a of the evaporator 2.

Providing such a ring member 9 makes it possible to continuously press the wick 6 against the wall 2a of the evaporator 2 even when the wick 6 undergoes plastic deformation due to creep or deterioration (deterioration of the silicone foam material, etc.) caused by prolonged use. Accordingly, it is possible to obtain adhesion between the wick 6 and the wall 2a of the evaporator 2 and maintain the cooling performance of the loop heat pipe 1 over time.

First Modification

Figure 4:
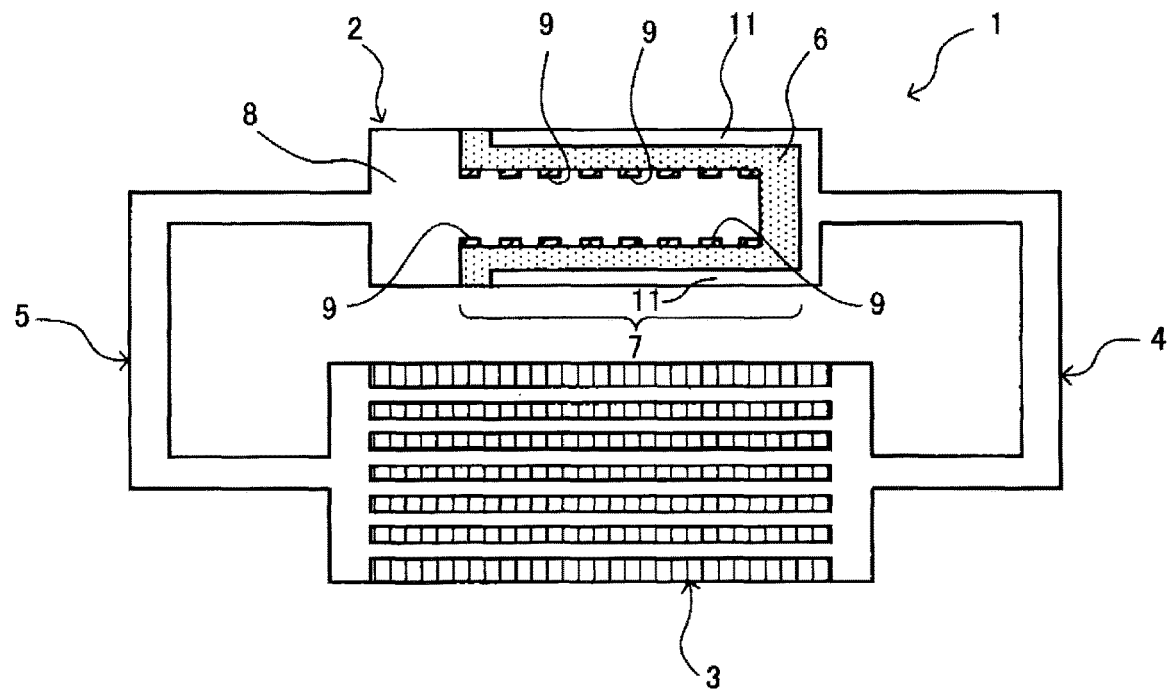
FIG. 4 is a diagram illustrating a configuration of a loop heat pipe according to a first modification.

Next, one modification of the loop heat pipe 1 according to the present embodiment (hereinafter referred to as the "first modification") will be described. FIG. 4 is a diagram illustrating a configuration of an evaporator of the first modification. The loop heat pipe 1 of the first modification is provided with multiple ring members 9 each as a wick deformation member, as illustrated in FIG. 4; hence, an entirety of the outer circumference portion (contact area) of the wick 6 is pressed against the wall 2a of the evaporator 2.

As described above, the entirety of the outer circumference portion of the wick 6 is pressed against the wall 2a of the evaporator 2; hence, even if the wick 6 undergoes some plastic deformation due to deterioration or creep of the wick 6 caused by prolonged use of the wick 6, an entirety of the outer circumference portion of the wick 6 may be continuously pressed against the wall 2a of the evaporator 2. Accordingly, it is possible to obtain adhesion between the wick 6 and the wall 2a of the evaporator 2 over the entirety of the outer circumferential portion of the wick 6 and maintain the cooling performance of the loop heat pipe 1 over time.

Second Modification

Figure 5:
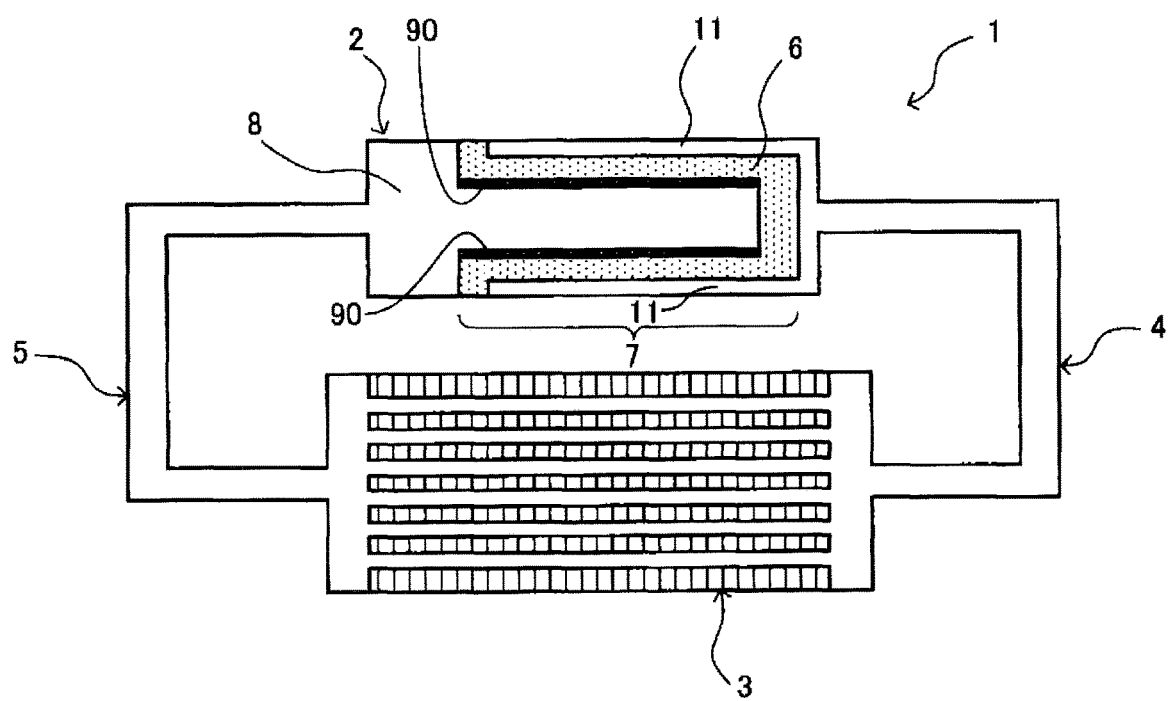
FIG. 5 is a diagram illustrating a configuration of a loop heat pipe according to a second modification.

Next, another modification of the loop heat pipe 1 according to the present embodiment (hereinafter referred to as the "second modification") will be described. FIG. 5 is a diagram illustrating a configuration of a evaporator a second modification. In the first modification described above, the multiple ring members 9 are disposed along a hollow axis of the wick 6 shaped to include empty space inside (hereinafter simply called "hollow-shaped wick 6") such that the entirety of the outer circumference portion (contact area) of the wick 6 is pressed against the wall 2a of the evaporator 2. In the second modification, a single wick deformation member, such as a cylindrical mesh member 90, is disposed such that the entirety of the outer circumference portion (contact area) of the wick 6 is pressed against the wall 2a of the evaporator 2.

The wick deformation member according to the second modification is a cylindrical mesh member 90 made of stainless steel or the like having an outer diameter larger than the inner diameter of the hollow portion of the wick 6, which is a hollow member, and primarily by using an elastic modulus of the wick 6 itself 6 preloads the outer circumference of the wick 6 toward the wall 2a of the evaporator 2. That is, providing such a cylindrical mesh member 90 allows the hollow portion of the wick 6 to expand radially outward or toward the wall 2a of the evaporator 2 by the cylindrical mesh member 90. As a result of the outer circumference portion of the wick 6 expanding radially outward or toward the wall 2a of the evaporator 2, the outer circumference portion of the wick 6 is pressed against the wall 2a of the evaporator 2. Thus, even if the wick 6 undergoes some plastic deformation due to the deterioration or creep caused by prolonged use, the entirety of the outer circumference portion of the wick 6 may continuously be pressed against the wall 2a of the evaporator 2, as in the first modification described above. Accordingly, it is possible to obtain adhesion between the wick 6 and the wall 2a of the evaporator 2 over the entirety of the outer circumferential portion of the wick 6 over time, and maintain the cooling performance of the loop heat pipe 1 over time.

The cylindrical mesh member 90 of the second modification is disposed in a transfer path of the working fluid, and the working fluid passes through openings (passage holes) of the cylindrical mesh member 90. An open ratio (a percentage of openings (passage holes) per unit area) of the cylindrical mesh member 90 is to be greater than porosity of the wick 6. For example, an open ratio of the cylindrical mesh member 90 is set to 80%, which is greater than porosity (50%) of the wick 6. Setting of the open ratio of the cylindrical mesh member 90 as above makes the cylindrical mesh member 90 not inhibit flowability of the liquid phase working fluid stored in the reservoir 8 from penetrating into the wick 6 by capillarity.

In the second modification, the wall 2a of the evaporator 2 is made of stainless steel, and the cylindrical mesh member 90 is made of stainless steel similarly to the wall 2a of the evaporator 2. Since the cylindrical mesh member 90 is made of a material having the same ionization tendency as the wall 2a of the evaporator 2, a potential difference between the wall 2a of the evaporator 2 and the cylindrical mesh member 90 is unlikely to occur, and corrosion is thus prevented. Note that different materials having the same ionization tendency may be used for the cylindrical mesh member 90 and the wall 2a of the evaporator 2.

Third Modification

Figure 6:
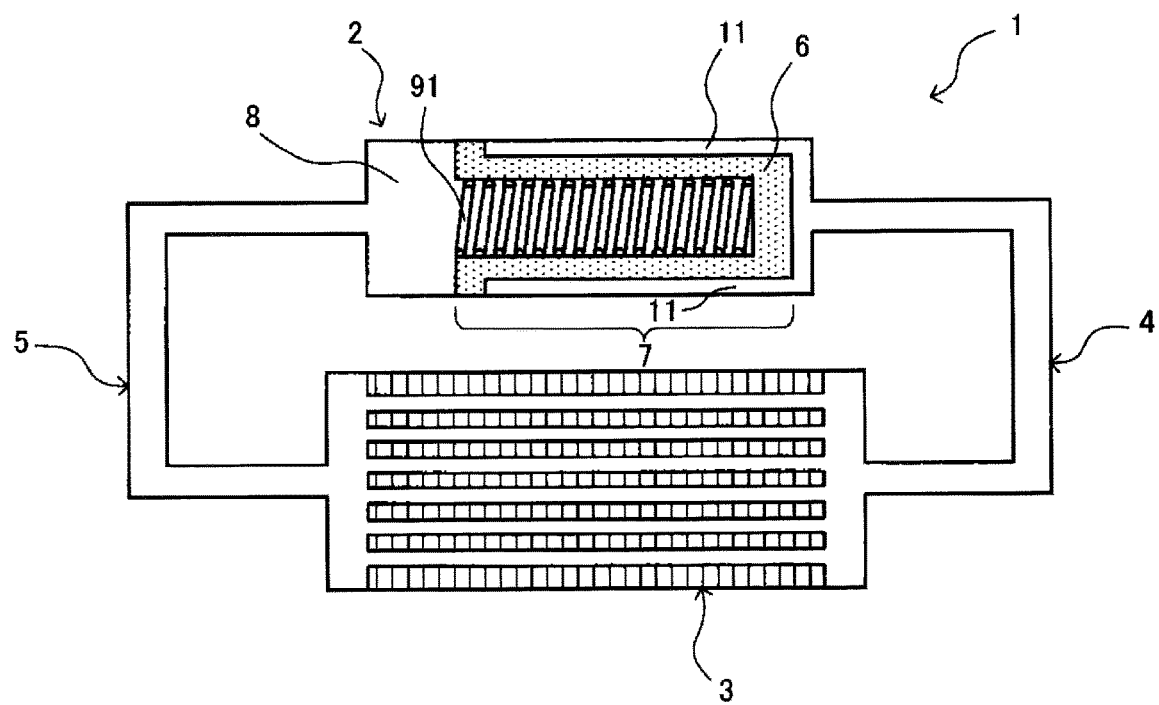
FIG. 6 is a diagram illustrating a configuration of a loop heat pipe according to a third modification.

Next, still another modification of the loop heat pipe 1 according to the present embodiment (hereinafter referred to as the "third modification") will be described. FIG. 6 is a diagram illustrating a configuration of a loop heat pipe 1 according to a third modification.

In the third modification, similar to the second modification described above, a single wick deformation member, such as a coil spring member 91, is disposed such that the coil spring member 91 preloads the entirety of the outer circumference portion (contact area) of the wick 6 toward the wall 2a of the evaporator 2.

Further, in the first and second modifications described above, the wick deformation member preloads the outer circumferential portion of the wick 6 toward the wall 2a of the evaporator 2 by using primarily an elastic modulus of the wick 6 itself. In the third modification, the wick deformation member itself has elasticity, and restoring force of the wick deformation member is also utilized to preload the outer circumference portion of the wick 6 toward the wall 2a of the evaporator 2.

The coil spring member 91, which is the wick deformation member of the third modification, is set such that a diameter of the unexpanded or uncontracted coil spring member 91 is larger than an inner diameter of a hollow portion of the wick 6, which is a hollow member. That is, providing such a coil spring member 91 allows the hollow portion of the wick 6 to expand radially outward or toward the wall 2a of the evaporator 2 by restoration force of the coil spring member 91. As a result of the outer circumference portion of the wick 6 expanding radially outward or toward the wall 2a of the evaporator 2, the outer circumference portion of the wick 6 is pressed against the wall 2a of the evaporator 2. Thus, even if the wick 6 undergoes some plastic deformation due to deterioration or creep caused by prolonged use, the entirety of the outer circumference portion of the wick 6 may continuously be pressed against the wall 2a of the evaporator 2, as in the first or the second modification described above. Accordingly, it is possible to obtain adhesion between the wick 6 and the wall 2a of the evaporator 2 over the entirety of the cuter circumferential portion of the wick 6 over time, and to maintain the cooling performance of the loop heat pipe 1 over time.

In addition, the coil spring member 91 of the third modification is disposed in a transfer path of the working fluid as in the aforementioned second modification, and the working fluid passes through gaps (passage holes or passage spaces) between coils of the coil spring member 91. An open ratio of the gaps of the coil spring member 91 is set to be greater than the porosity of the wick 6. Setting of the open ratio of the coil spring member 91 as above makes the coil spring member 91 not inhibit flowability of the liquid phase working fluid stored in the reservoir 8 from penetrating into the wick 6 by capillarity.

In the third modification, the wall 2a of the evaporator 2 is made of copper, and the coil spring member 91 is made of copper similarly to the wall 2a of the evaporator 2. Hence, since the coil spring member 91 is made of a material having the same ionization tendency as the wall 2a of the evaporator 2, a potential difference between the wall 2a of the evaporator 2 and the coil spring member 91 is unlikely to occur, and corrosion is thus prevented. Note that different materials having the same ionization tendency may be used for the coil spring member 91 and the wall 2a of the evaporator 2.

Figure 7:
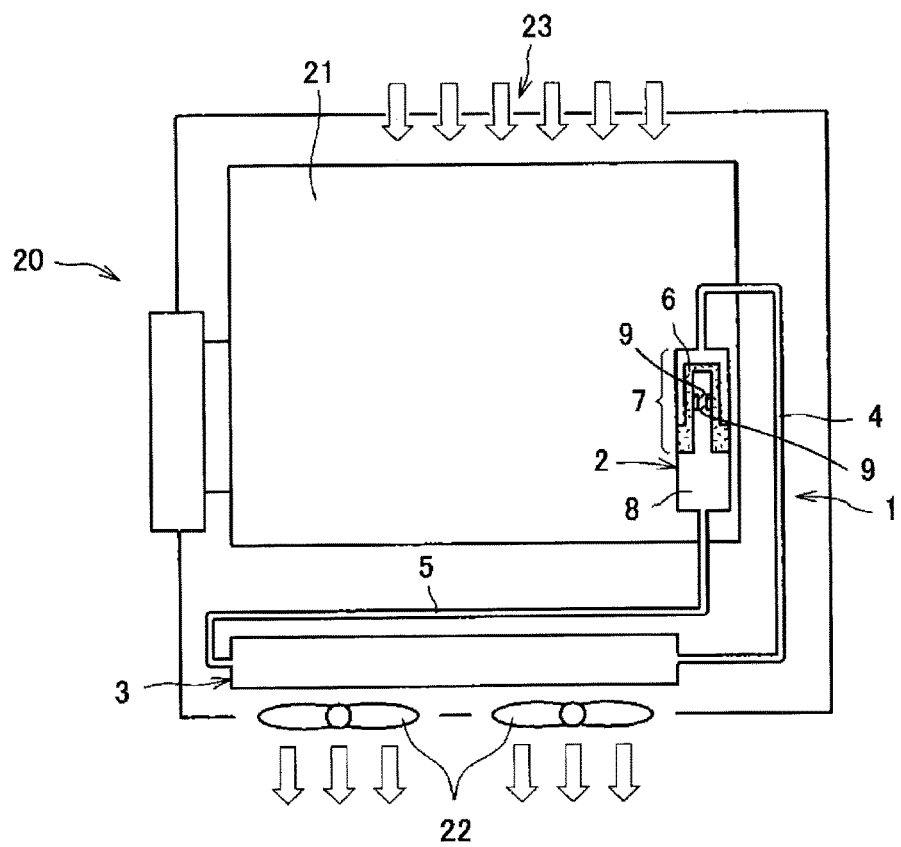
FIG. 7 is a diagram illustrating an example of an electronic device including a loop heat pipe according to an embodiment.

FIG. 7 is a diagram illustrating an example of an electronic device including a loop heat pipe 1 according to the present embodiment. The electronic device illustrated in FIG. 7 is an example of a projector 20 having an optical unit 21. Note that the electronic device, to which the loop heat pipe 1 according to the present embodiment may be applied, is not limited to a projector; the loop heat pipe 1 according to the present embodiment may also be applied to various electronic devices such as an image forming apparatus, including a printer, a copier, a facsimile machine, or a multifunction machine, a personal computer, a server, an electronic whiteboard, a television, a Blu-ray recorder, and a game machine.

The evaporator 2 (specifically the heat receiver 7) of the loop heat pipe 1 is disposed so as to contact a heat-generating portion of the optical unit 21. The evaporator 2 absorbs heat from a heat-generating portion of the optical unit 21 to cool a cooling object (the heat-generating portion of the optical unit 21, the optical unit 21, or the projector 20). The condenser 3 is disposed near exhaust fans 22 that are disposed on a lateral side of a casing of a projector 20. The exhaust tans 22 discharge air toward outside to generate airflow around the condenser 3 such that the condenser 3 is cooled by the generated airflow, thereby improving a heat dissipation effect in the condenser 3. Further, air supply ports 23 are disposed on another lateral side opposite to the lateral side of the casing where the exhaust fans 22 are disposed, and air taken from the air supply ports 23 passes through the inside of the projector 20 and is discharged from the exhaust fans 22.

In this example, a cooling device for cooling the projector 20 is provided with a loop heat pipe 1, and exhaust fans 22 for improving a heat dissipation effect of the loop heat pipe 1; however, blower fans to blow air toward the condenser 3 may be provided in place of the exhaust fans 22. Alternatively, the cooling device may only be provided with a loop heat pipe 1 alone without having any fans.

In addition, the loop heat pipe 1 according to the present embodiment and the cooling device provided with the loop heat pipe 1 are widely applicable to applications other than electronic devices. For example, a loop heat pipe 1 or a cooling device according to the present embodiment may be applied to a cooling device for cooling a chemical plant or the like having a reactor.

Second Embodiment

Figure 8:
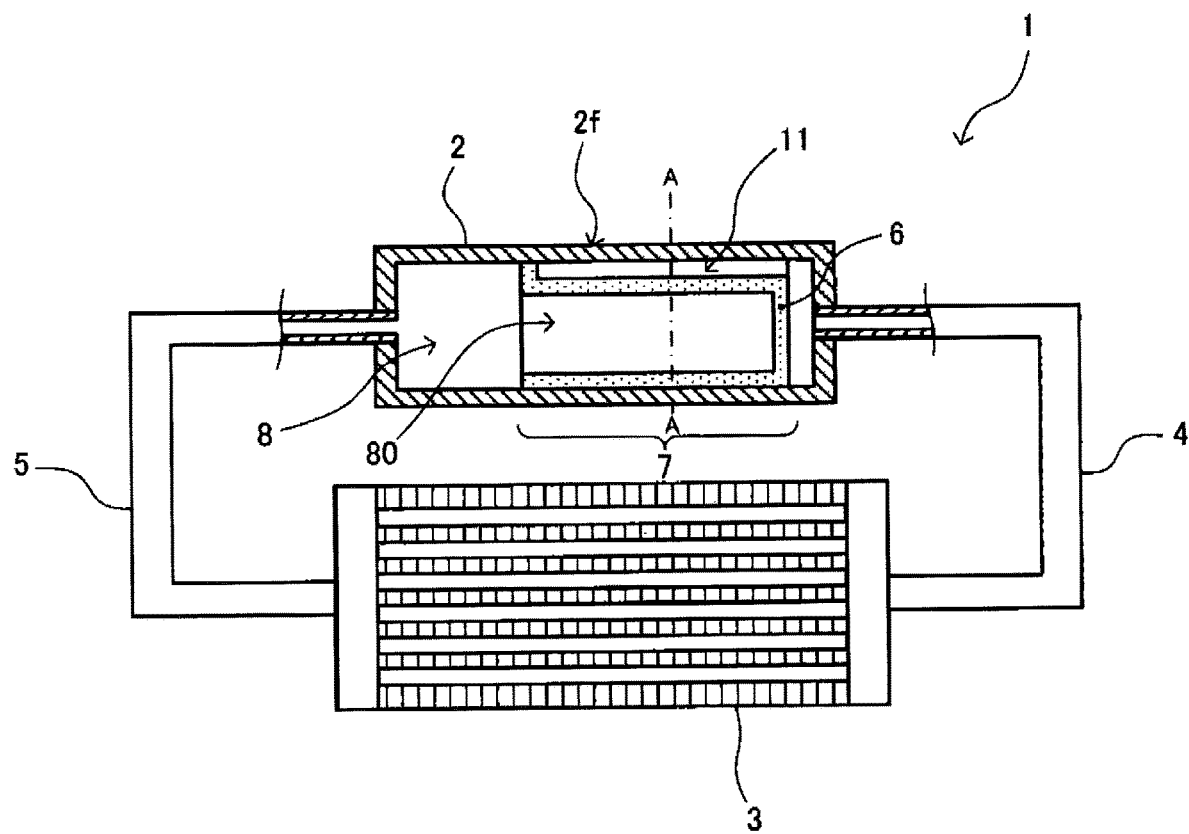
FIG. 8 is a diagram illustrating a configuration of a loop heat pipe according to a second embodiment.

FIG. 8 is a diagram illustrating a configuration of an evaporator of a second embodiment. As with the loop heat pipe 1 of the first embodiment described above with reference to FIG. 1, the loop heat pipe 1 of the second embodiment illustrated in FIG. 8 encloses a working fluid. The loop heat pipe 1 of the second embodiment includes an evaporator 2, a condenser 3, a steam tube 4, and a liquid tube 5. The loop heat pipe 1 of the first embodiment illustrated in FIG. 1 has the evaporator 2 with a cylindrical shape, whereas the loop heat pipe 1 of the second embodiment illustrated in FIG. 8 has the evaporator 2 with a plate-like shape. Since the loop heat pipe 1 according to the second embodiment has the same configuration as the loop heat pipe 1 according to the first embodiment except for the shape of the evaporator 2 and the shape of a member disposed inside the evaporator 2, duplicated description will be omitted where appropriate.

Figure 9:
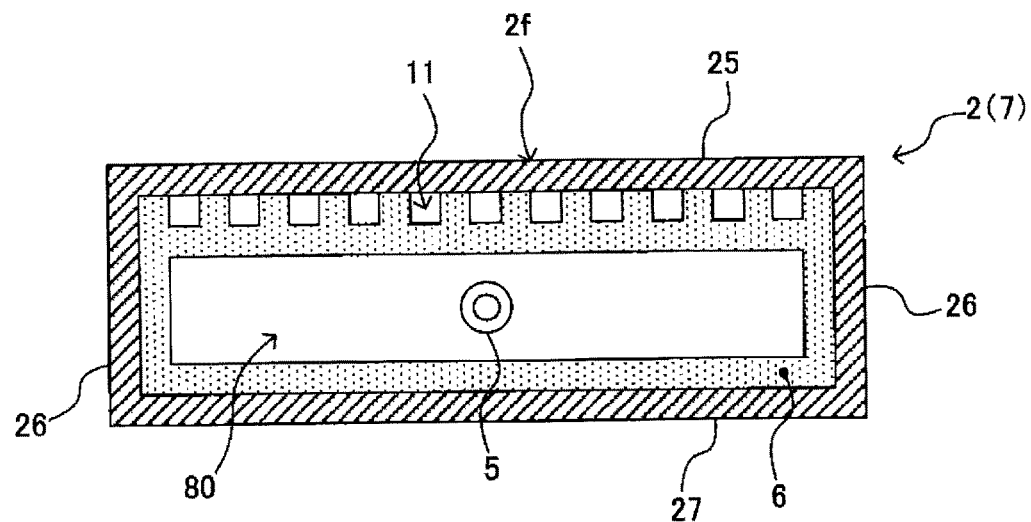
FIG. 9 is a cross-sectional diagram illustrating an evaporator of the loop heat pipe according to the second embodiment when the evaporator is cut along a line indicated by A-A in FIG. 8.

FIG. 9 is a cross-sectional diagram illustrating an evaporator 2 of the second embodiment when the evaporator 2 is cut along a line indicated by A-A in FIG. 8. As illustrated in FIGS. 8 and 9, the evaporator 2 of the second embodiment is a plate-like hollow member, and a steam tube 4 is connected to a wall at one end of the evaporator 2 in a working fluid moving direction (a horizontal direction in FIG. 8, and a depth direction in FIG. 9) and a liquid tube 5 is connected to a wall at the other end.

The evaporator 2 of the second embodiment includes a heat receiving wall 25, which forms a heat receiving surface 2f and corresponds to one of four walls extending in a working fluid moving direction inside the evaporator 2. The receiving surface 2f is disposed in a direction such that the heat receiving surface 2f faces a cooling object. The other three of the four walls include a heat receiving back wall 27 that faces the heat receiving wall 25, and two sidewalls 26 connecting both ends of the width direction (horizontal direction in FIG. 9) of the heat receiving wall 25 and a heat receiving back wall 27.

The wick 6 of the second embodiment is a plate-like hollow member made of a porous material, and one end of the wick 6 near the steam tube 4 is closed and the other end near the reservoir 8 is open. The wick 6 of the second embodiment includes multiple grooves 11 on a surface near the heat receiving wall 25 in an area extending in a working fluid moving direction from one end near the steam tube 4 to immediately before the other end near the reservoir 8. As illustrated in FIG. 9, the multiple grooves 11 are equally spaced in the width direction of a surface of the wick 6 near the heat receiving surface 2f (i.e., in a direction perpendicular to the extending directions of the grooves 11, and in the horizontal direction of FIG. 9). Portions of the surface of the wick 6 excluding the grooves 11 near the heat receiving surface 2f contact the inner wall surface of the heat receiving wall 25, where the heat receiving wall 25 forms a heat receiving surface 2f; and portions of the surface of the wick 6 provided with the grooves 11 near the heat receiving surface 2f form space portions with respect to the inner wall surface of the heat receiving wall 25 of the evaporator 2. For the arrangement of the grooves 11, the grooves 11 may be disposed not only on the surface that contacts the inner wall surface of the heat receiving wall 25 of the wick 6, but may also be disposed on other surfaces that contact the heat receiving back wall 27 and the sidewalls 26 of the wick 6.

The external size of the wick 6 in the cross-section illustrated in FIG. 9 is set to be slightly larger than the internal size of the evaporator 2. Note that the external size of the wick 6 includes a vertical length and a horizontal length in FIG. 9, and the internal size of the evaporator 2 includes a distance from the inner wall of the heat receiving wall 25 to the inner wall of the heat receiving back wall. 27, and a distance between the inner walls of the two sidewalls 26.

Accordingly, when the wick 6 is housed in the evaporator 2, the restoring force of the wick 6 causes the wick 6 to be in close contact with the inner wall surfaces of the heat receiving wall 25, the heat receiving back wall 27, and the inner wall surfaces of the two sidewalls 26. As described above, since the wick 6, is in close contact with the walls (25, 26 and 27) of the evaporator 2, the external heat is efficiently transmitted through the walls (25, 26 and 27) of the evaporator 2 to the wick 6.

The wick 6 also serves to separate the liquid phase and gas phase to prevent backflow of the gas phase working fluid into the reservoir 8. Since the wick 6 is made of a porous material, the liquid phase working fluid stored in the reservoir 8 penetrates into the wick 6 due to a pressure differential or capillarity in the working fluid itself. This pressure differential or capillarity in the working fluid also serves as a pump for delivering a liquid phase working fluid from the condenser 3 to the evaporator 2.

In the loop heat pipe 1 according to the second embodiment, heat from outside is conducted and propagated from the heat receiving surface 2f of the evaporator 2 to the liquid phase working fluid within the wick 6 through the heat receiving wall 25, and the working fluid is evaporated to change to a gas phase. The gas phase working fluid is fed through the grooves 11 to the steam tube 4.

The wick 6 of the second embodiment, as in the first embodiment, is made of porous rubber, and provides a greater elastic-force than a porous resin. In addition, the wick 6 is formed with the external size slightly larger than the internal size of the walls (25, 26 and 27) of evaporator 2 as described above. These configurations provide high adhesion of the wick 6 with respect to the walls (25, 26 and 27) of the evaporator due to an elastic modulus (restoring force) of the wick 6 housed within the evaporator 2. This increases the heat transfer efficiency from the walls (25, 26 and 27) of the evaporator 2 to the wick 6, thereby improving the cooling performance of the loop heat pipe 1.

In addition, since the wick 6 is made of porous rubber, an elastic area of the wick 6 becomes large; this makes it possible to prevent local pore collapse due to dimensional errors during manufacturing. That is, even if the wick 6 is compressed by inserting the wick 6 within the walls (25, 26 and 27) of the evaporator 2, the compressive deformation of the wick 6 that would be accompanied by pore collapse is dispersed over a wide area. Thus, it is possible to prevent severe pore collapse in a local area such as in the vicinity of the outer surfaces, where pores of the wick 6 are in contact with the walls (25, 26 and 27). As a result, since flow obstruction of the working fluid due to local pore collapse is unlikely to occur, it is possible to obtain smooth flow of the working fluid to achieve more reliable cooling performance. The porous rubber used for the wick 6 may be similar to that of the first embodiment.

The wick 6 disposed inside the evaporator 2 of the loop heat pipe 1 illustrated in FIGS. 8 and 9 is a plate-like hollow member. More specifically, the wick 6 has a hollow portion acting as a wick deformation member installation space 80 in which the wick deformation member is installed.

The plate-like evaporator 2 includes a heat receiving surface 2f that is a planar portion disposed on its outer wall surface. In the first embodiment described above, the evaporator 2 is cylindrical, the evaporator 2 contacts a cooling object with respect to a point on the outer circumference of the circular cross-section, and the entire evaporator 2 has a linear contact portion along a height direction of the cylinder. As a result, it is difficult to obtain a wide contact area. When the contact area is small, the efficiency of heat transfer from the cooling object to the evaporator 2 is reduced, and the cooling efficiency is degraded. By contrast, the evaporator 2 of the second embodiment includes a planar heat receiving surface 2f. When the planar heat receiving surface 2f is in contact with the cooling object, the contact portion forms a surface, and a wide contact area may be obtained, thereby improving the cooling efficiency.

In addition, a device such as the optical unit 21 covered by a casing typically has planar outer wall surfaces for the casing. When a cooling object, i.e., a device to be cooled, has planar surfaces as our, wall surfaces, the heat receiving surface 2f of the second embodiment is contacted with a planar surface of the outer wall surface of the cooling object; as a result, a large contact area may be obtained, and the cooling efficiency may be improved.

In a second embodiment, a wick deformation member is disposed to preload an inner surface of a hollow portion of the wick 6 toward the heat receiving wall 25, where the heat receiving wall 25 forms the heat receiving surface 2f. In a second embodiment, a wick deformation member, which is disposed within a hollow portion 80 of the wick 6, has a vertical length greater than a distance between an upper inner wall of a portion of the wick 6 that contacts the inner surface of the heat receiving wall 25 and a lower inner wall of a portion of the wick 6 that contacts the inner surface of the heat receiving back wall 27 (a distance in a vertical direction in FIG. 9). Such a wick deformation member enables the wick 6 to deform so as to increase the distance between the upper inner wall of the portion of the wick 6 that contacts the inner surface of the heat receiving wall 25 and the lower inner wall of the portion of the wick 6 that contacts the inner surface of the heat receiving back wall 27. This causes the wick 6 to be sandwiched by the wick deformation member and each of the inner wall surface of the heat, receiving wall 25 and the inner wall surface of the heat receiving back wall 27, such that the wick deformation member presses the wick 6 against both the inner wall surface of the heat receiving wall 25 and the inner wall surface of the heat receiving back wall 27. The wick deformation member can thus use elasticity of the wick 6 itself to press an outer surface of the wick C against the inner wall surface of the heat receiving wall 25 of the evaporator 2.

The following wick deformation members according to fourth to sixth modifications are configured to have a length in a direction from the heat receiving wall 25 to the heat receiving back wall 27 greater than the distance between the upper and lower inner wall surfaces which form the wick deformation member installation space 80 (a vertical direction in FIG. 9). This configuration causes the wick 6 to deform so as to increase the distance between these two opposite surfaces of the wick 6 (i.e., upper and lower surfaces of the wick deformation member installation space 80 illustrated in FIGS. 8 and 9), thereby pressing the wick 6 against the inner wall surface of the heat receiving wall 25.

Fourth Modification

Figure 10:
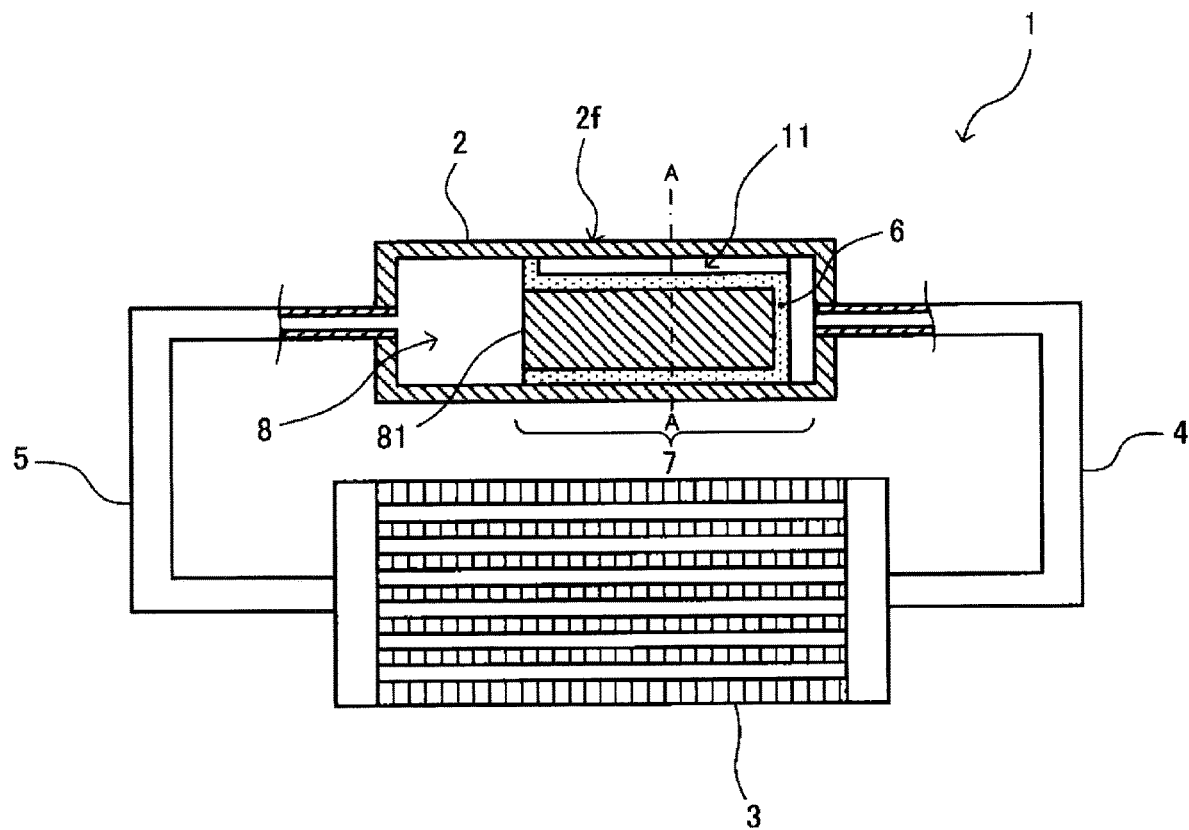
FIG. 10 is a diagram illustrating a configuration of a loop heat, pipe according to a fourth modification.

Next, one modification (hereinafter referred to as "fourth modification") in which a wick deformation member is disposed in the loop heat, pipe 1 of the second embodiment having a plate-like evaporator 2 will be described. FIG. 10 is a diagram illustrating a configuration of an evaporator 2 of the fourth modification, and FIG. 11 is a cross-sectional diagram illustrating the evaporator 2 of the loop heat pipe 1 according to the fourth modification when the evaporator 2 is cut along a line indicated by A-A in FIG. 10.

Figure 11:
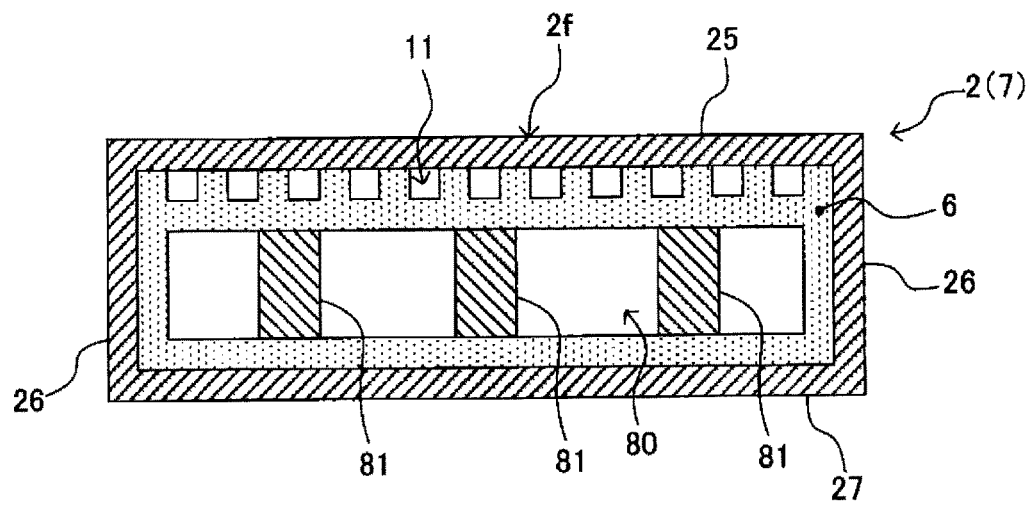
FIG. 11 is a cross-sectional diagram illustrating an evaporator of the loop heat pipe according to the fourth modification when the evaporator is cut along a line indicated by A-A in FIG. 10.

The loop heat pipe 1 of the fourth modification includes, as illustrated in FIGS. 10 and 11, multiple plate members 81 made of ceramic or the like, each acting as a wick deformation member for preloading the heat receiving wall 25 facing surface of the wick 6 toward the inner wall surface of the heat receiving wall 25 of the evaporator 2. The plate members 81 of the fourth modification each have a vertical length from its upper surface to its lower surface (vertical direction in FIG. 11) greater than a vertical length from an upper surface to a lower surface of the wick deformation member installation space 80.

The plate members 81 utilize elasticity of the wick 6 itself to preload the heat receiving wall 25 facing surface of the wick 6 toward the inner wall surface of the heat receiving wall 25 of the evaporator 2. That is, disposing of such plate members 81 as the above increases the distance between the heat receiving wall 25 facing surface of the wick 6 (the upper surface of the wick deformation member installation space 80 in FIG. 11) and the lower surface of the hollow portion of the wick 6 (the lower surface of the wick deformation member installation space 80 in FIG. 11). This expands the distance between the upper surface and the lower surface of the hollow portion of the wick 6. As a result, the heat receiving wall 25 facing surface of the wick 6 is pressed against the inner wall surface of the heat receiving wall 25.

Such plate members 81 disposed as above are configured to continuously press the wick 6 against the inner wall surface of the heat receiving wall 25 of the evaporator 2 even in the case of the wick 6 having slight deterioration (deterioration of the silicone foam material, etc.) or the wick 6 undergoing some plastic deformation due to prolonged use or creep. Accordingly, it is possible to obtain adhesion between the wick 6 and the inner wall surface of the heat receiving wall 25 of the evaporator 2 and to maintain the cooling performance of the loop heat pipe 1 over time.

Fifth Modification

Figure 12:
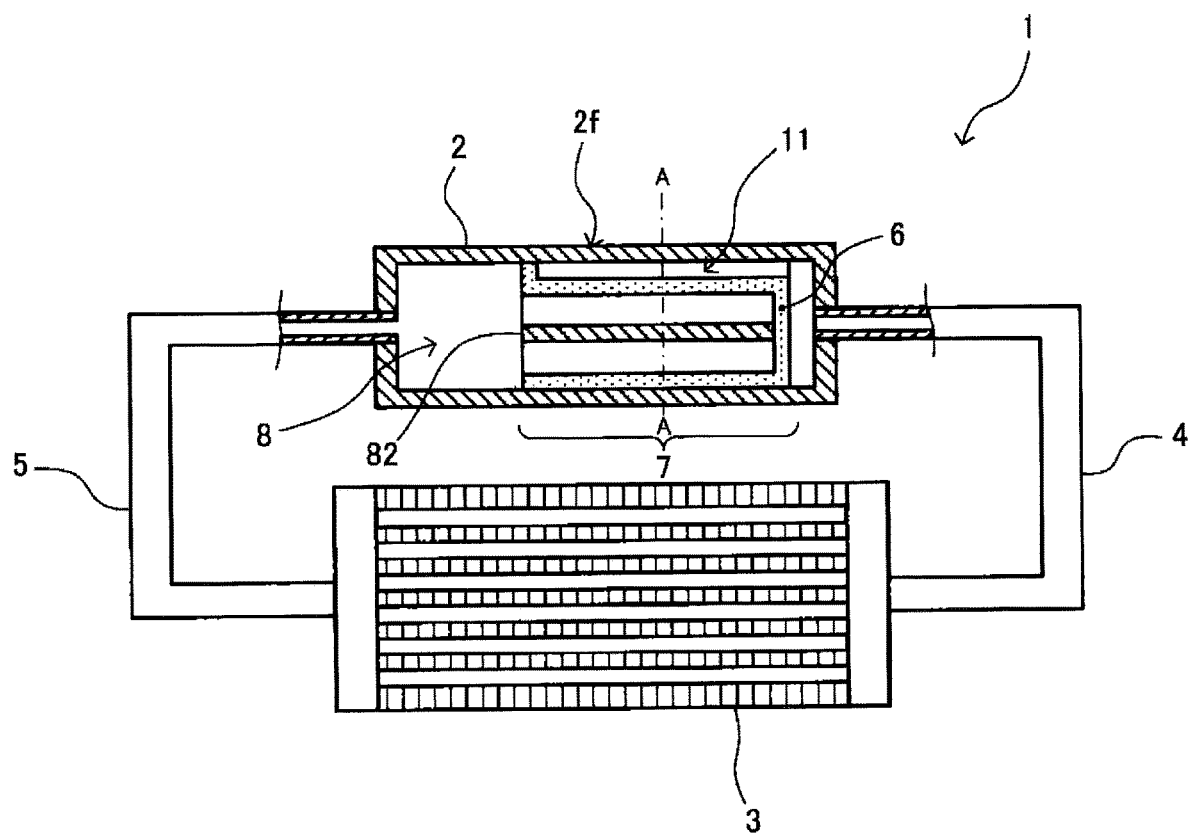
FIG. 12 is a diagram illustrating a configuration of a loop heat pipe according to a fifth modification.
Figure 13:
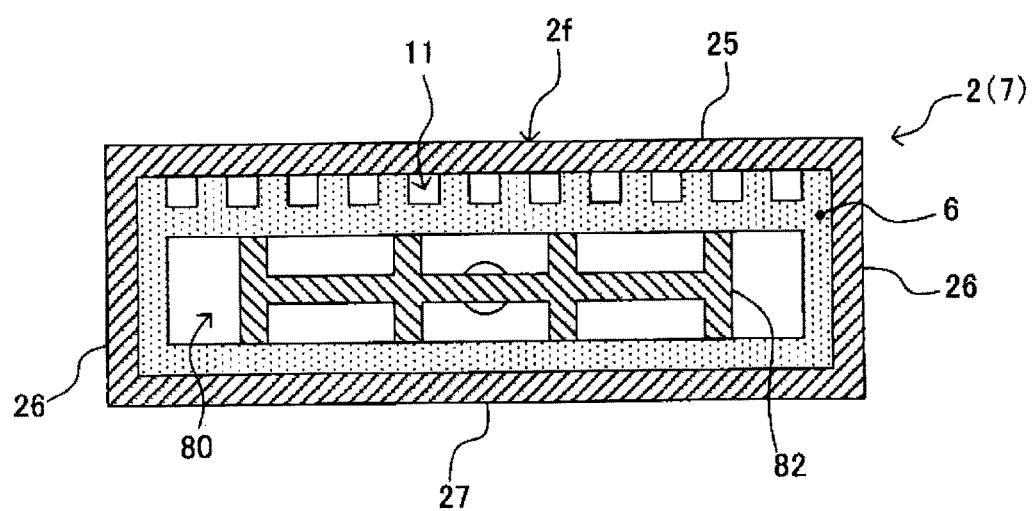
FIG. 13 is a cross-sectional diagram illustrating an evaporator of the loop heat pipe according to the fifth modification when the evaporator is cut along a line indicated by A-A in FIG. 12.

Next, another modification in which a wick deformation member is disposed in the loop heat pipe 1 of the second embodiment having a plate-like evaporator 2 (hereinafter referred to as the "fifth modification") will be described. FIG. 12 is a diagram illustrating a configuration of an evaporator 2 of the fifth modification, and FIG. 13 is a cross-sectional diagram illustrating the evaporator 2 of the loop heat pipe 1 according to the fifth modification when the evaporator 2 is cut along a line indicated by A-A in FIG. 12.

The loop heat pipe 1 of the fifth modification has a wick deformation member having a shape differing from the shape of the wick deformation member in the loop heat pipe 1 of the fourth modification described above. The wick deformation member of the fifth modification is a connected plate member 82, which is formed by connecting a plate member perpendicularly to the multiple plate members 81 in the fourth modification. The connected plate member 82 of the fifth modification has a vertical length from its upper surface to its lower surface (a length in a vertical direction in FIG. 13) greater than a vertical length from an upper surface to a lower surface of the wick deformation member installation space 80. According to the fifth modification, it is possible to obtain adhesion between the wick 6 and the inner wall surface of the heat receiving wall 25 of the evaporator 2 and to maintain the cooling performance of the loop heat pipe 1 over time, as in the fourth modification. Further, according to the fifth modification, since the connected plate member 82 is formed by connecting a plate member to the multiple plate members 81 extending vertically in a direction from the heat receiving wall member 25 to the heat receiving back wall member 27, the connected plate member 82 acting as a wick deformation member may be stably and accurately disposed.

Sixth Modification

Figure 14:
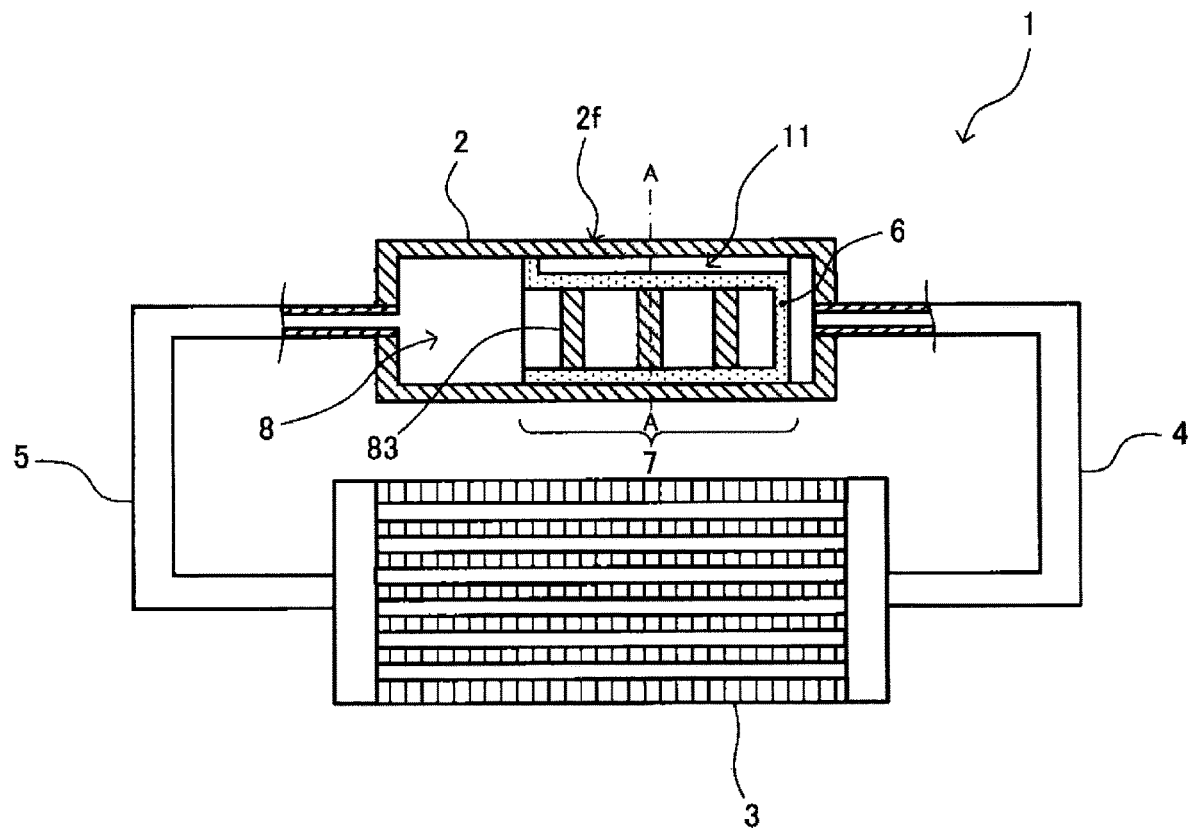
FIG. 14 is a diagram illustrating a configuration of a loop heat pipe according to a sixth modification.
Figure 15:
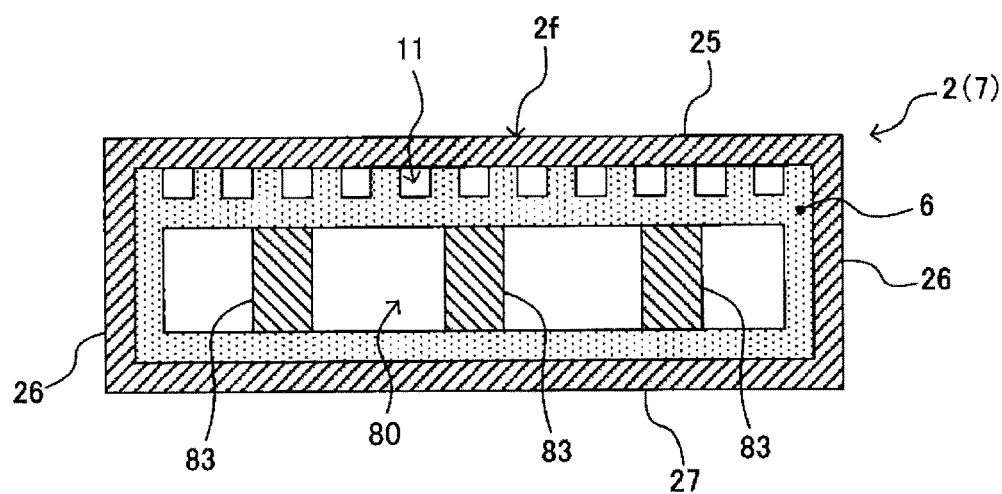
FIG. 15 is a cross-sectional diagram illustrating an evaporator of the loop heat pipe according to the sixth modification when the evaporator is cut along a line indicated by A-A in FIG. 14.

Next, still another modification in which a wick deformation member is disposed in the loop heat pipe 1 of the second embodiment having a plate-like evaporator 2 (hereinafter referred to as the "sixth modification") will be described. FIG. 14 is a diagram illustrating a configuration of the loop heat pipe 1 according to the sixth modification, and FIG. 15 is a cross-sectional diagram illustrating an evaporator 2 of the loop heat pipe 1 according to the sixth modification when the evaporator 2 is cut along a line indicated by A-A in FIG. 14.

The loop heat pipe 1 of the sixth modification has a wick deformation member having shape and a material differing from the shape and the material of the wick deformation member in the loop heat pipe 1 of the fourth modification described above. The wick deformation member of the sixth modification includes column members 83 each made of porous metal or the like. The column members 83 of the sixth modification each have a vertical length from its upper surface to its lower surface (vertical direction in FIG. 15) greater than a vertical length from an upper surface and a lower surface of the wick deformation member installation space 80, where the wick deformation member installation space 80 corresponds to a hollow portion of the wick 6.

The column members 83 utilize elasticity of the wick 6 itself to preload the heat receiving wall 25 facing surface of the wick 6 toward the inner wall surface of the heat receiving wall 25 of the evaporator 2. That is, disposing of such column members 83 as the above increases the distance between the heat receiving wall 25 facing surface of the wick 6 (the upper surface of the wick deformation member installation space 80 in FIG. 15) and a lower surface of the hollow portion of the wick 6 (the lower surface of the wick deformation member installation space 80 in FIG. 15). This expands the distance between the upper surface and the lower surface of the hollow portion of the wick 6. As a result, the heat receiving wall 25 facing surface of the wick 6 is pressed against the inner wall surface of the heat receiving wall 25.

In addition, since the column members 83 acting as wick deformation members are porous, the working fluid may pass through passage holes of the wick deformation members. Accordingly, it is possible to obtain adhesion between the wick 6 and the inner wall surface of the heat receiving wall 25 of the evaporator 2, to maintain the cooling performance of the loop heat pipe 1, to obtain flowability of the working fluid, and to maintain the stable operation of the loop heat pipe 1 over time.

Seventh Modification

Next, still another modification in which a wick deformation member is disposed in the loop heat pipe 1 of the second embodiment having a plate-like evaporator 2 (hereinafter referred to as the "seventh modification") will be described. The loop heat pipe 1 of the seventh modification has wick deformation members having a material differing from the material of the wick deformation members in the sixth modification described above. In the loop heat pipe 1 of the seventh modification, a rubber member is used as a material for each of the column members 83.

In the seventh modification, both elasticity of the wick 6 and an elastic modulus of the wick deformation members (column members 83) are used to preload the heat receiving wall 25 facing surface of the wick 6 toward the inner wall surface of the heat receiving wall 25 of the evaporator 2. Disposing of such column members 83 made of a rubber member expands a distance between the heat receiving wall 25 facing surface of the wick 6 (the upper surface of the wick deformation member installation space 80 in FIG. 15) and the lower surface of the hollow portion of the wick 6 (the lower surface of the wick deformation member installation space 80 in FIG. 15). This expands the distance between the upper surface and the lower surface of the hollow portion of the wick 6. As a result, the heat receiving wall 25 facing surface of the wick 6 is pressed against the inner wall surface of the heat receiving wall 25.

In the seventh modification, the wick deformation members (column members 83) are formed by a material with an elastic modulus lower than elasticity of the wick 6; thus, a deformation amount of the wick deformation members is greater than the deformation amount of the wick 6. Accordingly, even in the case of the wick 6 having slight deterioration (deterioration of the silicone foam material, etc.) or the wick 6 undergoing some plastic deformation due to prolonged use or creep, the deformation amount of the wick 6 may be compensated by the deformation amount of the column members 83 acting as the wick deformation members. Accordingly, it is possible to obtain more stable adhesion between the wick 6 and the inner wall surface of the heat receiving wall 25 of the evaporator 2 and maintain the cooling performance of the loop heat pipe 1 over time.

In the seventh modification, each wick deformation member (column member 83) made of a rubber member may be a porous member. With such configuration, it may be possible to obtain flowability of the working fluid and to improve operation stability of the loop heat pipe 1, in addition to the above-described effect. In the seventh modification, a configuration of the wick deformation members (column members 83) of the sixth modification being made of rubber has been described. However, a configuration of a wick deformation member of the first to fifth modifications being made of rubber may also be used.

The loop heat pipe 1 of the second embodiment is also applicable to electronic devices such as a projector 20 illustrated in FIG. 7. In addition, the loop heat pipe 1 according to the second embodiment and the cooling device provided with the loop heat pipe 1 are widely applicable to applications other than electronic devices. For example, the loop heat pipe 1 or the cooling device according to the second embodiment may be applied to a cooling device for cooling a chemical plant or the like having a reactor.

The above illustrations are merely examples, and specific effects may be provided for each of the following aspects.
(Aspect A)

A loop heat pipe 1, comprising:

an evaporator 2 configured to absorb heat from outside by a wall 2a to evaporate a working fluid, such as ethanol, from a liquid phase to a gas phase;

a condenser 3 configured to condense the gas phase working fluid introduced from the evaporator 2 into a liquid phase;

an elastic wick (wick 6) configured to contact an inner wall of the evaporator 2 by an elastic force; and a wick deformation member configured to deform the elastic wick 6, such as a ring member 9, a cylindrical mesh member 90, and a coil spring member 91, so as to increase a contact pressure of the elastic wick 6 against the inner wall of the evaporator 2.

According to the aspect A, even in a case of the elastic wick 6 undergoing some plastic deformation over time due to deterioration or creep, the elastic wick 6 is enabled to continuously be pressed against the inner wall of the evaporator 2 by an elastic force from a deformed portion of the elastic wick 6, which is deformed by the wick deformation member.

This configuration provides adhesion between the elastic wick 6 and the inner wall of the evaporator 2, and maintains a heat transfer efficiency from the wall 2a of the evaporator 2 to the elastic wick 6 even in a case of the elastic wick 6 undergoing plastic deformation. As a result, a transfer efficiency of heat from outside to the elastic wick 6 through the wall 2a of the evaporator 2 may be maintained, a decrease in an evaporation efficiency of the working fluid may be prevented, and a decrease in cooling performance of the loop heat pipe 1 may be prevented.
(Aspect B)

According to aspect B, the elastic wick 6 in the aspect A is made of porous rubber.

According to aspect B, since the elastic wick 6 is made of porous rubber to obtain high elasticity, it is easy to increase adhesion of the elastic wick 6 with respect to the inner wall of the evaporator 2. In addition, since the wick 6 is made of porous rubber, an elastic area of the wick 6 becomes large, which makes it possible to prevent local pore collapse due to dimensional errors during manufacturing. That is, even if the elastic wick 6 is compressed within the evaporator 2, the compressive deformation of the wick 6 that would be accompanied by pore collapse is dispersed over a wide area to prevent severe pore collapse in a local area.
(Aspect C)

According to aspect C, the wick deformation member in the aspects A or B is configured to cause the elastic wick 6 to deform so as to increase a contact Pressure over a contact area of the elastic wick 6 against the inner wall of the evaporator 2. According to aspect C, even in a case of the wick 6 undergoing plastic deformation, the contact area of the elastic wick 6 may be continuously pressed against the inner wall of the evaporator 2 in entirety.
(Aspect D)

According to aspect D, the wick deformation member in any of aspects A to C is disposed in a transfer path of the working fluid, and includes passage holes through which the working fluid passes to have an open ratio greater than porosity of the elastic wick 6. That is, the wick deformation member may be a cylindrical mesh member 90 or a coil spring member 91. According to aspect D, flowability of the liquid phase working fluid that penetrates into the elastic wick 6 by capillarity will not readily obstructed by the wick deformation member.

(Aspect E)

According to aspect E, the wick deformation member in any of aspects A to D is made of a material having same ionization tendency as the wall 2a of the evaporator 2. According to aspect E, a potential difference does not easily occur between the wall 2a of the evaporator 2 and the wick deformation member, and corrosion is thus prevented.

(Aspect F)

According to aspect F, an outer wall of the evaporator 2 in any of aspects A to E is provided with a planar portion such as a heat receiving surface 2f. According to aspect F, it is possible to obtain a wide contact area of a contact portion of the evaporator 2 with respect to a cooling object, to improve the cooling efficiency.

(Aspect G)

According to aspect G, a wick deformation member, such as a plate member 81, a connected plate member 82 and a column member 83, in the aspect F deforms the elastic wick 6 so as to increase the contact pressure of the elastic wick 6 against the inner wall of the planar portion 2f of the evaporator 2. According to aspect. G, even in a case of the elastic wick 6 undergoing some plastic deformation over time due to deterioration or creep, the elastic wick 6 is enabled to continuously be pressed against the inner wall of the planar portion 2f of the evaporator 2 by an elastic force from a deformed portion of the elastic wick 6, which is deformed by the wick deformation member. This configuration provides adhesion between the inner wall of the planar portion 2f of the evaporator 2 and the elastic wick 6 over time. As a result, the transfer efficiency of heat from outside to the elastic wick 6 through the wall 2a forming the planar portion 2f may be maintained, a decrease in evaporation efficiency of the working fluid may be prevented, and a decrease in cooling performance of the loop heat pipe 1 may be prevented.

(Aspect H)

According to aspect H, the evaporator 2 includes an opposite planar portion (e.g., an outer wall surface of the heat receiving back wall. 27) at a position opposite to the planar portion 2f, and the wick deformation member causes the elastic wick 6 to deform so as to increase a distance between a first portion of the elastic wick 6, which contacts the inner wall of the planar portion 2f of the evaporator 2, and a second portion of the elastic wick 6, which contacts the inner wall of the opposite planar portion (27) of the evaporator 2.

According to aspect H, the wick deformation member presses the interposed elastic wick 6 against each of the inner wall of the planar portion 2f and the inner wall of the opposite planar portion 27. Accordingly, by a reaction force of the second portion of the elastic wick 6, which contacts the inner wall of the opposite planar portion (27) of the evaporator 2, the wick deformation member is preloaded toward the first portion of the elastic wick 6, which contacts the inner wall of the planar portion 2f of the evaporator 2. As a result, the outer surface of the elastic wick 6 is pressed against the inner wall of the planar portion 21 of the evaporator 2.

(Aspect I)

According to aspect I, the evaporator 2 in any of the aspects F to H has a plate-like shape. According to aspect I, the evaporator 2 has planar portions for the outer walls. In aspect I, compared to an evaporator 2 with a planar portion obtained by cutting away a cylindrical portion, a ratio of a planar portion to the entire outer walls of the evaporator 2 may be increased, and the cooling performance for a cooling object that contacts the planar portion may thus be improved.

(Aspect J)

According to aspect J, the wick deformation member in any of aspects A to I is made of a porous material. According to aspect J, since the working fluid may be moved through passage holes of the wick deformation member, flowability of the working fluid may be obtained; as a result, the stable operation of the loop heat pipe 1 may be obtained.

(Aspect K)

According to aspect K, the wick deformation member in any aspect of A to J is made of an elastic material. According to aspect K, the elastic wick 6 is continuously pressed against the inner wall of the evaporator 2 by elastic force from the wick deformation member and the elastic wick 6.

(Aspect L)

According to aspect. L, a cooling device includes the loop heat pipe 1 according to any aspect of A to K. According to aspect L, it is possible to prevent cooling performance from deteriorating even in a case of the elastic wick 6 undergoing plastic deformation.

(Aspect M)

According to aspect M, an electronic device includes the loop heat pipe 1 according to any aspect of A to K. According to aspect M, it is possible to prevent cooling performance from deteriorating even in a case of the elastic wick 6 undergoing plastic deformation.

According to the present invention, it is possible to provide adhesion between the elastic wick 6 and the inner wall of the evaporator 2 even in a case of the elastic wick 6 undergoing some plastic deformation due to deterioration or creep.

The present invention is not limited to the specifically disclosed embodiments, and variations and modifications may be made without departing from the scope of the present invention.

What is claimed is:

1. A loop heat pipe, comprising:
   an evaporator configured to absorb heat from outside via a wall of the evaporator to evaporate a working fluid from a liquid phase to a gas phase;
   a condenser configured to condense a gas phase working fluid introduced from the evaporator into a liquid phase;
   an elastic wick having a hollow shape with a cavity, the elastic wick being in contact with an inner wall of the evaporator by an elastic force from the elastic wick; and
   a wick deformation member that is rigid and is at a position with respect to the elastic wick, an outer circumferential portion of the elastic wick being compressed toward the inner wall of the evaporator due to contact with the wick deformation member such that the elastic wick is in a deformed state and a compressed state against the inner wall of the evaporator to apply contact pressure of the elastic wick against the inner wall of the evaporator,
   wherein the elastic wick has smaller cross-section at regions of the elastic wick where the wick deformation member contacts the elastic wick as compared to regions of the elastic wick where the wick deformation member does not contact the elastic wick.

2. The loop heat pipe according to claim 1, wherein the elastic wick is made of porous rubber.

3. The loop heat pipe according to claim 1, wherein the wick deformation member is positioned with respect to the elastic wick to increase a contact pressure over a contact area of the elastic wick against an inner surface of the wall of the evaporator.

4. The loop heat pipe according to claim 1, wherein
the wick deformation member is disposed in a transfer path of the working fluid, and
the wick deformation member includes passage holes through which the working fluid passes so that the wick deformation member has an open ratio greater than porosity of the elastic wick.

5. The loop heat pipe according to claim 1, wherein the wick deformation member is made of a material having a same ionization tendency as the wall of the evaporator.

6. A cooling device comprising:
the loop heat pipe according to claim 1.

7. The loop heat pipe of claim 1, wherein the wick deformation member is made of a rigid material so that the wick is compressed only by the elasticity of the wick.

8. The loop heat pipe of claim 1, wherein the wick deformation member is made of ceramic.

9. The loop heat pipe of claim 1, wherein the wick deformation member includes a plurality of circular ring members spaced apart from one another in a longitudinal direction of the elastic wick, each of the plurality of circular ring members having an outer diameter greater than the first size.

10. An electronic device comprising:
the loop heat pipe according to claim 1.

11. A loop heat pipe, comprising:
an evaporator configured to absorb heat from outside by a first wall and a second wall to evaporate a working fluid from a liquid phase to a gas phase;
a condenser configured to condense a gas phase working fluid introduced from the evaporator into a liquid phase;
an elastic wick that is in contact with an inner surface of the first wall of the evaporator and an inner surface of the second wall of the evaporator by an elastic force from the elastic wick; and
a wick deformation member that is rigid and is at a position with respect to the elastic wick, an outer circumferential portion of the elastic wick being compressed toward the inner wall of the evaporator due to contact with the wick deformation member such that the elastic wick is in a deformed state and a compressed state against the first and second walls of the evaporator to apply contact pressure of the elastic wick against the first and second walls of the evaporator,
wherein the first wall of the evaporator includes a planar portion,
the evaporator includes an opposite planar portion at a position opposite to the planar portion,
the wick deformation member includes at least one planar member extending in a direction from the planar portion to the opposite planar portion to press the wick against both the inner surface of the first wall and the inner surface of the second wall of the evaporator such that the wick is in a compressed state in a particular direction from the planar portion to the opposite planar portion, and
for an upper inner wall of a first portion and a lower inner wall of a second portion of the elastic wick when the elastic wick is in an uncompressed state, the first portion contacts the inner surface of the first wall of the planar portion of the evaporator, and the second portion contacts the inner surface of the second wall of the opposite planar portion of the evaporator,
wherein the elastic wick has smaller cross-section at regions of the elastic wick where the wick deformation member contacts the elastic wick as compared to regions of the elastic wick where the wick deformation member does not contact the elastic wick.

12. The loop heat pipe according to claim 11, wherein the wick deformation member is positioned with respect to the elastic wick to increase a contact pressure of the elastic wick against the inner surface of the first wall of the planar portion of the evaporator.

13. The loop heat pipe according to claim 12, wherein
the wick deformation member is positioned with respect to the elastic wick to increase a distance between a first portion and a second portion of the elastic wick, the first portion contacting the inner surface of the first wall of the planar portion of the evaporator, and the second portion contacting the inner surface of the second wall of the opposite planar portion of the evaporator.

14. The loop heat pipe according to claim 11, wherein the evaporator has a plate-like shape.

15. The loop heat pipe of claim 11, wherein the wick deformation member includes a plurality of the planar members, which are spaced apart from one another in a longitudinal direction of the elastic wick.

\* \* \* \* \*